United States Patent
Yoshioka et al.

(10) Patent No.: US 7,180,765 B2
(45) Date of Patent: Feb. 20, 2007

(54) FERROELECTRIC MEMORY

(75) Inventors: Hiroshi Yoshioka, Kawasaki (JP); Toru Takeshima, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/024,718

(22) Filed: Dec. 30, 2004

(65) Prior Publication Data

US 2005/0265065 A1 Dec. 1, 2005

(30) Foreign Application Priority Data

May 28, 2004 (JP) .............................. 2004-159032

(51) Int. Cl.
*G11C 11/22* (2006.01)
(52) U.S. Cl. ...................................... 365/145; 365/210
(58) Field of Classification Search ................. 365/145
See application file for complete search history.

(56) References Cited

U.S. PATENT DOCUMENTS

| | | | | |
|---|---|---|---|---|
| 5,237,533 A | * | 8/1993 | Papaliolios | .................. 365/207 |
| 5,880,989 A | * | 3/1999 | Wilson et al. | ............... 365/145 |
| 6,191,971 B1 | * | 2/2001 | Tanaka et al. | ............... 365/145 |
| 6,487,130 B2 | * | 11/2002 | Endo et al. | ............ 365/189.09 |
| 2003/0026123 A1 | | 2/2003 | Takashima | |

FOREIGN PATENT DOCUMENTS

| | | |
|---|---|---|
| EP | 0 721 190 | 7/1996 |
| EP | 1304701 | 2/2003 |
| EP | 1 304 701 | 4/2003 |
| EP | 1 306 851 | 5/2003 |
| JP | 2001319472 A | 11/2001 |
| JP | 2004013951 A | 1/2004 |

* cited by examiner

*Primary Examiner*—Thong Q. Le
(74) *Attorney, Agent, or Firm*—Arent Fox LLP

(57) ABSTRACT

A ferroelectric memory including a ferroelectric capacitor to store data; a bit line inputting and outputting data with respect to the ferroelectric capacitor; a control circuit having a first field effect transistor to be connected to the bit line and a reference potential, and to lower potential of the bit line when the bit line is connected to the ferroelectric capacitor; a reference ferroelectric capacitor to store fixed data; a reference bit line to input and output data with respect to the reference ferroelectric capacitor; and a second field effect transistor to be connected to the reference bit line and the reference potential, in which the first and second field effect transistors configure a current mirror circuit, is provided.

14 Claims, 5 Drawing Sheets

FERROELECTRIC MEMORY

CROSS-REFERENCE TO RELATED APPLICATIONS

This application is based upon and claims the benefit of priority from the prior Japanese Patent Application No. 2004-159032, filed on May 28, 2004, the entire contents of which are incorporated herein by reference.

BACKGROUND OF THE INVENTION

1. Field of the Invention

The present invention relates to a ferroelectric memory, and particularly, to a ferroelectric memory that includes a ferroelectric capacitor and a bit line.

2. Description of the Related Art

The ferroelectric capacitors have a nonvolatile feature as well as a high-speed data reading and writing feature. Therefore, the ferroelectric capacitors are put into practical use as ferroelectric memories (FeRAMs) by taking advantage of these features. The ferroelectric memories can exercise the nonvolatile feature at a high speed and with low power consumption in the same manner as SRAMs do, so that the ferroelectric memories are utilized for LSIs for IC cards and tag chips, and are widely used in the market.

The readout of the potential of a cell of the ferroelectric memory is determined depending on the capacitance ratio of the cell to a bit line, as in DRAMs. When the capacitance is small, the memory area is decreased and the capacitance of the bit line lowers, so that the voltage applied to the ferroelectric capacitor of the cell lowers. Therefore, the charge supplied from the ferroelectric capacitor to the bit line reduces, and thereby the readout margin of a sense amplifier reduces. On the contrary, a devisal is conceivable in which a load is applied to the bit line to thereby prevent the reduction of voltage applied to the ferroelectric capacitor of the cell.

Further, since the capacitance to be added to the bit line is required to correspond to that of the ferroelectric capacitor of the cell, it is presumable that a great amount of gate capacitance or source-drain capacitance, or a ferroelectric capacitor or the like be utilized. However, the gate capacitance and the source-drain capacitance have a problem of increasing area, and the ferroelectric capacitor has a problem of insufficient accuracy in fluctuation.

Further, the ferroelectric memories are disclosed in Japanese Patent Application Laid-Open No. 2001-319472 (Patent Document 1) and Japanese Patent Application Laid-Open No. 2004-13951 (Patent Document 2).

SUMMARY OF THE INVENTION

It is an object of the present invention to provide a ferroelectric memory capable of generating stable bit-line potential without regard to the capacitance value of a bit line.

According to one aspect of the present invention, there is provided a ferroelectric memory including a ferroelectric capacitor to store data; a bit line inputting and outputting data with respect to the ferroelectric capacitor; a first switching element selectively connecting the ferroelectric capacitor and the bit line; a control circuit having a first field effect transistor to be connected to the bit line and a reference potential, and to lower potential of the bit line when the bit line is connected to the ferroelectric capacitor; a reference ferroelectric capacitor to store fixed data; a reference bit line to input and output data with respect to the reference ferroelectric capacitor; a reference switching element selectively connecting the reference ferroelectric capacitor and the reference bit line; and a second field effect transistor to be connected to the reference bit line and the reference potential, in which the first field effect transistor and the second field effect transistor configure a current mirror circuit.

DETAILED DESCRIPTION OF THE PREFERRED EMBODIMENTS

Figure 6:
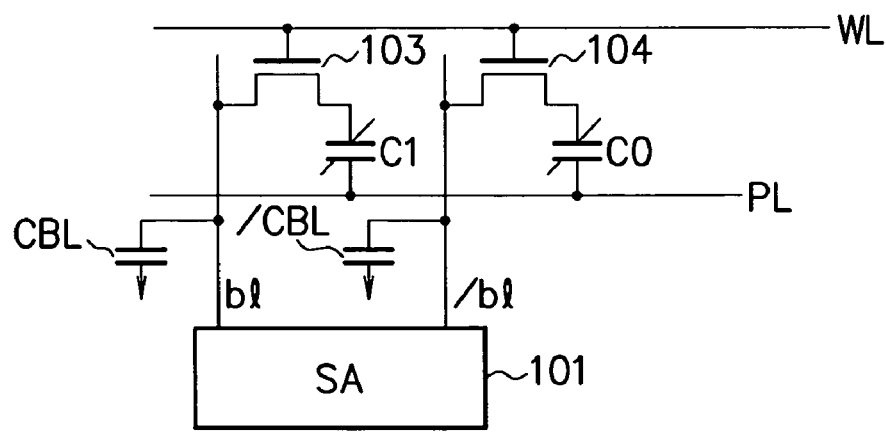
FIG. 6 is a circuit diagram showing a configuration example of a ferroelectric memory.

FIG. 6 is a circuit diagram showing a configuration example of a ferroelectric memory. An n-channel MOS (metal-oxide semiconductor) field effect transistor (FET) 103 is connected to a word line WL with a gate thereof, to a bit line "bl" with a drain thereof, and to a plate line PL with a source thereof via a ferroelectric capacitor C1. Hereinafter, the MOSFET is simply referred to as a "transistor". An n-channel transistor 104 is connected to the word line WL with a gate thereof, to a complementary bit line "/bl" with a drain thereof, and to the plate line PL with a source thereof via a ferroelectric capacitor C0 (zero). Between the bit line "bl" and ground potential (reference potential), there exists parasitic capacitance CBL, and between the complementary bit line "/bl" and the ground potential (reference potential), there exists parasitic capacitance /CBL. A sense amplifier 101 is connected to the bit line "bl" and the complementary bit line "/bl". This configuration forms one memory cell. The transistors 103, 104 serve as switching elements.

The ferroelectric capacitors C0, C1 store data that complement each other. Specifically, the ferroelectric capacitor C1 stores data "1" while the ferroelectric capacitor C0 stores data "0 (zero)", and the ferroelectric capacitor C1 stores the data "0" while the ferroelectric capacitor C0 stores the data "1". The bit line "bl" and the complementary bit line "/bl" can input and output data with respect to the ferroelectric capacitor C1 and the ferroelectric capacitor C0, respectively. The transistor 103 selectively connects the ferroelectric capacitor C1 and the bit line "bl" in accordance with electrical potential of the word line WL. The transistor 104 selectively connects the ferroelectric capacitor C0 and the complementary bit line "/bl" in accordance with the electrical potential of the word line WL. The sense amplifier 101 amplifies a potential difference between the bit line "bl" and the complementary bit line "/bl".

Figure 7:
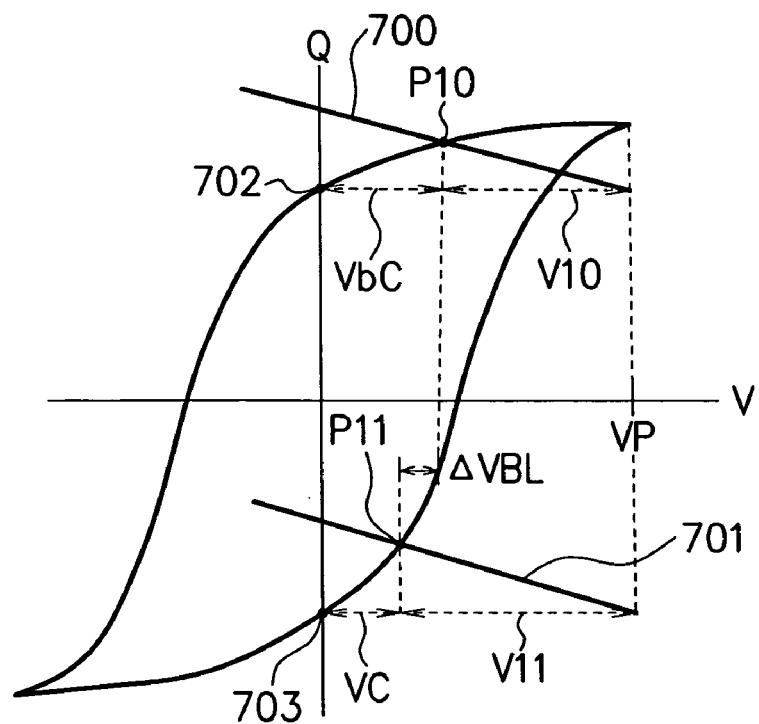
FIG. 7 is a graphic chart showing a hysteresis curve of a ferroelectric capacitor.

FIG. 7 is a graphic chart showing a hysteresis curve of the ferroelectric capacitors C0, C1. The horizontal axis indicates the voltage V of the ferroelectric capacitor, and the vertical axis indicates a polarization Q. For instance, when the plate line PL is at 0 (zero) V, two states 702, 703 are possible to exist. For instance, the state 702 indicates the data "0" and the state 703 indicates the data "1". Description will be given on the assumption that the ferroelectric capacitor C1 be in the state 703 and the ferroelectric capacitor C0 be in the state 702, as an example.

When the plate line PL is applied a potential VP, the ferroelectric capacitor C1 comes into a state P11. Specifically, a series connection between the ferroelectric capacitor C1 and the bit-line parasitic capacitance CBL is applied the potential VP. The voltage of the ferroelectric capacitor C1 is VC, and the voltage of the bit line "bl" comes to V11. These voltages are determined by the capacitance ratio of the ferroelectric capacitor C1 to the bit-line parasitic capacitance CBL. The total of the voltages VC and V11 becomes the voltage-VP. A straight line 701 indicates the ratio of voltage corresponding to the bit-line parasitic capacitance CBL to charge. A cross-point P11 of the straight line 701 and the hysteresis curve is the voltage VC of the ferroelectric capacitor C1.

Meanwhile, when the plate line PL is applied the potential VP, the ferroelectric capacitor C0 comes into a state P10. Specifically, a series connection between the ferroelectric capacitor C0 and the complementary bit-line parasitic capacitance /CBL is applied the potential VP. The voltage of the ferroelectric capacitor C0 is VbC, and the voltage of the complementary bit line "/bl" comes to V10. These voltages are determined by the capacitance ratio of the ferroelectric capacitor C0 and the complementary bit-line parasitic capacitance /CBL. The total of the voltages VbC and V10 becomes the voltage VP. A straight line 700 indicates the ratio of voltage corresponding to the complementary bit-line parasitic capacitance /CBL to charge. A cross-point P10 of the straight line 700 and the hysteresis curve is the voltage VbC of the ferroelectric capacitor C0.

At this time, the potential of the bit line "bl" is V11, and the potential of the complementary bit line "/bl" is V10. Then, the potential difference therebetween is V11−V10=VBL. The sense amplifier 101 amplifies this potential difference VBL. Accordingly, as the potential difference VBL increases, the margin of the sense amplifier increases, so that the data with higher reliability can be obtained.

Figure 8:
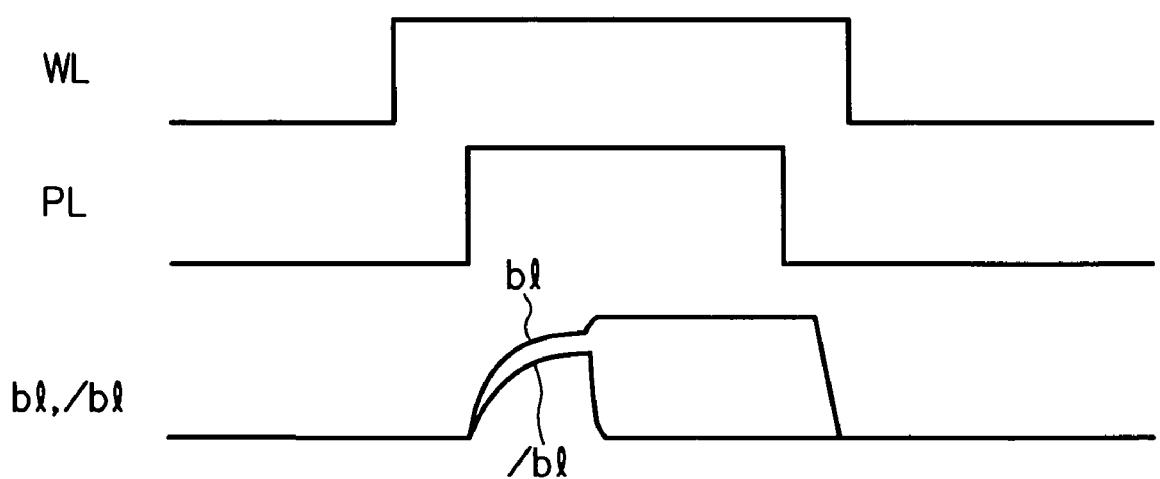
FIG. 8 is a timing chart for illustrating an operation of a ferroelectric memory.

FIG. 8 is a timing chart for illustrating an operation of a ferroelectric memory. When the potential of the word line WL is at low level, the transistors 103, 104 are OFF. The bit line "bl" is disconnected from the ferroelectric capacitor C1 to thereby have a voltage of 0V. The complementary bit line "/bl" is disconnected from the ferroelectric capacitor C0 to thereby have a voltage of 0V.

Subsequently, when the potential of the word line WL comes to high level, the transistors 103, 104 are turned ON. The bit line "bl" is connected to the ferroelectric capacitor C1, and the complementary bit line "/bl" is connected to ferroelectric capacitor C0. When the potential of the plate line PL is 0V, the potentials of the bit line "bl" and the complementary bit line "/bl" are 0V.

Subsequently, the plate line PL is brought into high level (for example to VP). Then, the bit line "bl" comes to have the potential V11, and the complementary bit line "/bl" comes to have the potential V10. The potential difference between the bit line "bl" and the complementary bit line "/bl" is VBL.

Subsequently, when the sense amplifier 101 is activated, the potential difference between the bit line "bl" and the complementary bit line "/bl" is amplified. Specifically, the bit line "bl" comes to high level (power source potential) and the complementary bit line "/bl" comes to low level (0V). In accordance with the potentials of the bit line "bl" and the complementary bit line "/bl", a readout data can be outputted to outside.

After that, the plate line PL is brought into low level, the sense amplifier 101 is inactivated, and the word line WL is brought into low level.

Figure 9A:
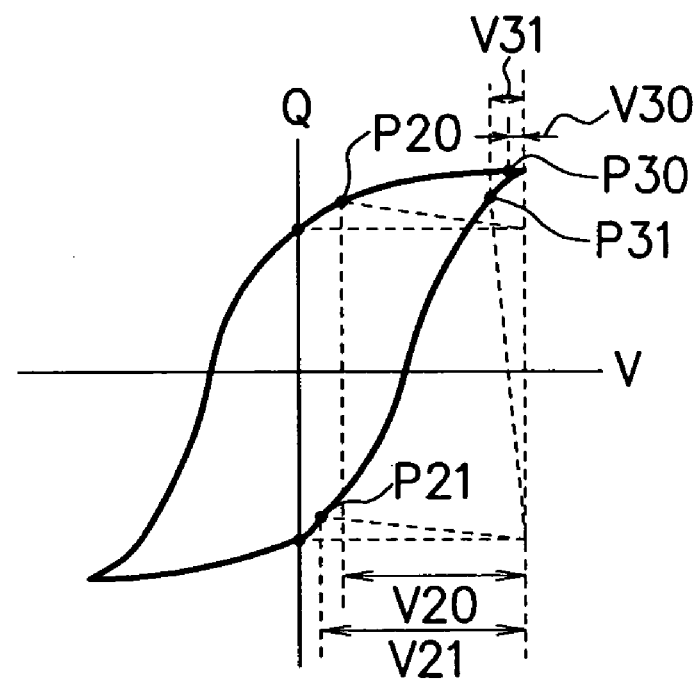
FIGS. 9A to 9D are views showing hysteresis characteristics of a ferroelectric capacitor.
Figure 9B:
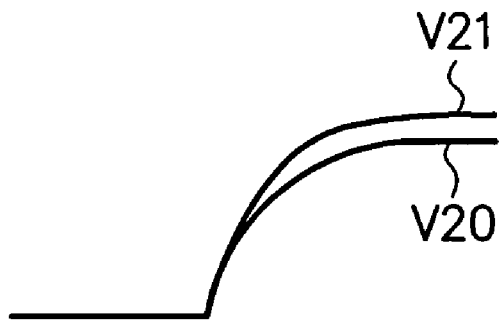
Figure 9C:
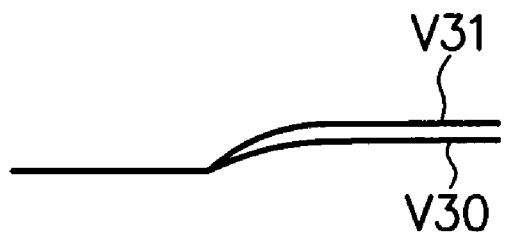
Figure 9D:
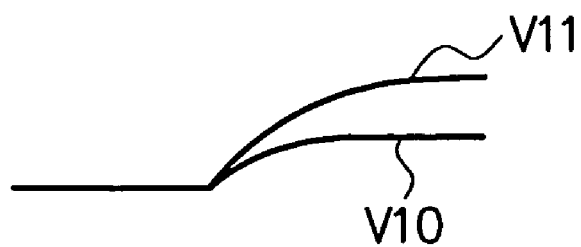

FIG. 9D shows the potential V11 of the bit line "bl" and the potential V10 of the complementary bit line "/bl" both shown in FIG. 7. As described above, the potential difference between the bit line "bl" and the complementary bit line "/bl" is VBL, which is preferably larger. The potential difference VBL varies depending on the size of the parasitic capacitance CBL of the bit line "bl" and the parasitic capacitance /CBL of the complementary bit line "/bl". Incidentally, the parasitic capacitances CBL and /CBL are substantially the same, and the ferroelectric capacitors C1 and C0 are substantially the same. It is disadvantageous for the parasitic capacitances CBL and /CBL to be excessively large as well as excessively small, since both cause the potential difference VBL to lower. This will be described with reference to FIGS. 9A to 9C.

FIG. 9A is a graphic chart showing hysteresis curves of the ferroelectric capacitors C1, C0. First, a case, in which the plate line PL is brought into high level, and the bit line "bl" comes into a state P21 and the complementary bit line "/bl" comes into a state P20, will be described. In this case, the potential of the bit line "bl" comes to V21 and the potential of the complementary bit line "/bl" comes to V20. As shown in FIG. 9B, the potential difference VBL between the potential V21 of the bit line "bl" and the potential V20 of the complementary bit line "/bl" becomes smaller than that of the case in FIG. 9D.

Subsequently, a case, in which the plate line PL is brought into high level, and the bit line "bl" comes into a state P31 and the complementary bit line "/bl" comes into a state P30, will be described. In this case, the potential of the bit line "bl" comes to V31 and the potential of the complementary bit line "/bl" comes to V30. As shown in FIG. 9C, the potential difference VBL between the potential V31 of the bit line "bl" and the potential V30 of the complementary bit line "/bl" becomes smaller than that of the case in FIG. 9D.

As described above, when the parasitic capacitances CBL, /CBL are excessively small or excessively large, the potential difference VBL becomes small, as shown in FIGS. 9B and 9C. When the parasitic capacitances CBL, /CBL have appropriate values, the potential difference VBL becomes large as shown in FIG. 9D. In other words, when the plate line PL is brought into high level, if the polarization Q of the ferroelectric capacitor C1 and the ferroelectric capacitor C0 is excessively small or excessively large, the potential difference VBL becomes small, as shown in FIGS. 9B and 9C. When the plate line PL is brought into high level, if the polarization Q of the ferroelectric capacitors C1, C0 comes to an appropriate value, the potential difference VBL becomes large, as shown in FIG. 9D. Still, in other words, as shown in FIGS. 9B and 9C, when the plate line PL is brought into high level, if the potentials of the bit line "bl" and the complementary bit line "/bl" are excessively small or excessively large, the potential difference VBL becomes small. As shown in FIG. 9D, when the plate line PL is brought into high level, if the potentials of the bit line "bl" and the complementary bit line "/bl" come to appropriate values, the potential difference VBL becomes large.

First Embodiment

Figure 1:
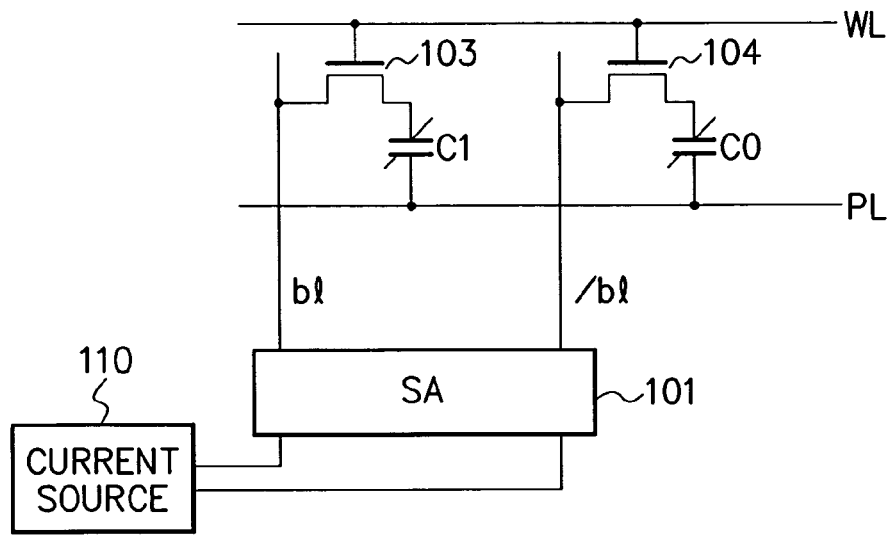
FIG. 1 is a circuit diagram showing a configuration example of a ferroelectric memory according to a first embodiment of the present invention.

FIG. 1 is a circuit diagram showing a configuration example of a ferroelectric memory according to a first embodiment of the present invention. The ferroelectric memory in FIG. 1 is configured to have a current source 110 in addition to the ferroelectric memory in FIG. 6, having the same configuration as of the ferroelectric memory in FIG. 6 except the current source 110. Even though the description of the parasitic capacitances CBL, /CBL will be omitted for the ferroelectric memory in FIG. 1, practically, the parasitic capacitances CBL, /CBL exist in the same manner as in the case of FIG. 6. Also, the parasitic capacitances CBL, /CBL exist in ferroelectric memories in FIG. 2 and FIG. 4, which will be described later.

The current source 110 is a control circuit that is connected to the bit line "bl" and the complementary bit line "/bl" so as to lower the potentials of the bit line "bl" and the complementary bit line "/bl" when the word line WL and the plate line PL is at high level. More specifically, the current source 110 lowers such potentials of the bit line "bl" and the complementary bit line "/bl" as V21, V20 shown in FIG. 9B to such appropriate potentials as V11 and V10 shown in FIG. 9D. When the potentials of the bit line "bl" and the complementary bit line "/bl" are excessively large as shown in FIG. 9B, it is possible to increase the potential difference VBL to larger as shown in FIG. 9D, by lowering the potentials of the bit line "bl" and the complementary bit line "/bl" using the current source 110.

Second Embodiment

Figure 2:
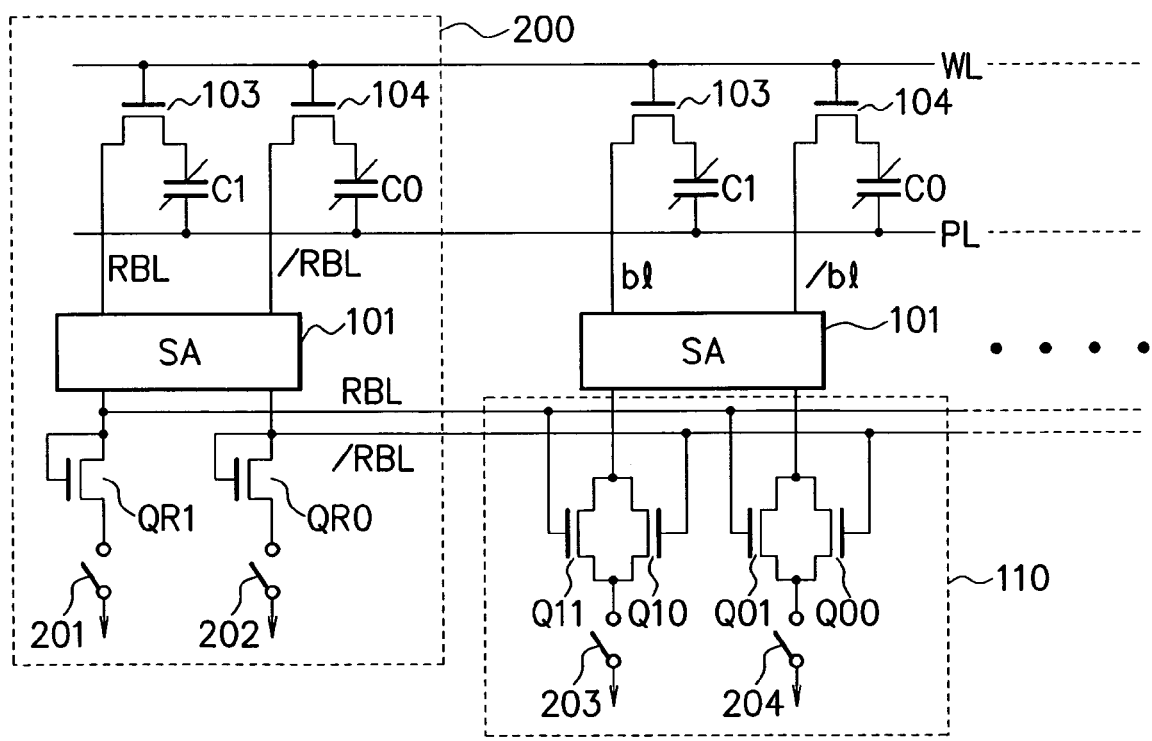
FIG. 2 is a circuit diagram showing a configuration example of a ferroelectric memory according to a second embodiment of the present invention.

FIG. 2 is a circuit diagram showing a configuration example of a ferroelectric memory according to a second embodiment of the present invention, in which the ferroelectric memory is embodied in more concrete form than that of the first embodiment. The second embodiment is basically the same as the first embodiment, and the description below will be given for differences. In the present embodiment, a reference circuit 200 is additionally provided and the current source 110 is embodied in more concrete form. The current source 110 includes n-channel transistors Q00, Q01, Q10, Q11 and switching elements 203, 204.

The ferroelectric memory includes a number of memory cells, allowing a number of data to be stored. A single memory cell includes the two transistors 103, 104 and the two ferroelectric capacitors C1, C0. The single reference circuit 200 is provided for a number of memory cells.

The reference circuit 200 includes the transistors 103, 104, the ferroelectric capacitors C1, C0, a bit line RBL, a complementary bit line /RBL, and the sense amplifier 101 in the same manner as in the memory cell. Although the bit line RBL and the complementary bit line /RBL have the same configurations as of the bit line "bl" and the complementary bit line "/bl" and have parasitic capacitances CBL, /CBL, different reference numbers are used for the purpose of distinguishing them. In the reference circuit 200 and the memory cell, the gates of the transistors 103, 104 are connected to the same word line WL, and also the plate line PL is used in common. However, in the reference circuit 200, the ferroelectric capacitor C1 stores fixed data "1" and the ferroelectric capacitor C0 stores fixed data "0 (zero)". The ferroelectric capacitor C0 and the ferroelectric capacitor C1 store fixed data complementing each other.

As for an n-channel transistor QR1, the gate and the drain are connected to each other and the source is connected to the ground potential (reference potential) via a switching element 201. The mutual connection point of the gate and the drain is connected to the reference bit line RBL. As for an n-channel transistor QR0 (zero), the gate and the drain are connected to each other and the source is connected to the ground potential via a switching element 202. The mutual connection point of the gate and the drain is connected to the complementary reference bit line /RBL.

Subsequently, the configuration of the current source 110 will be described. As for the n-channel transistor Q11, the gate is connected to the reference bit line "RBL", the drain is connected to the bit line "bl", and the source is connected to the ground potential via the switching element 203. As for the n-channel transistor Q10, the gate is connected to the complementary reference bit line /RBL, the drain is connected to the bit line "bl", and the source is connected to the ground potential via the switching elements 203. The transistor Q10 and the transistor Q11 are connected in parallel to each other.

As for the n-channel transistor Q01, the gate is connected to the reference bit line RBL, the drain is connected to the complementary bit line "/bl", and the source is connected to the ground potential via the switching elements 204. As for the n-channel transistor Q00, the gate is connected to the complementary reference bit line /RBL, the drain is connected to the complementary bit line "/bl", the source is connected to the ground potential via the switching elements 204. The transistor Q01 and the transistor Q00 are connected in parallel to each other. The transistors QR1, Q11, and Q01 configure a current mirror circuit and the same current flows therein. The transistors QR0, Q10, Q00 configure a current mirror circuit and the same current flows therein.

The reference circuit 200 is a circuit to cause the same current as of the actual memory cell to flow with the help of the current mirror circuit. The currents flowing in the transistors QR1, QR0 are represented by Ir1 and Ir0, and the currents flowing in the transistors Q11, Q10, Q01, Q00 are represented by I11, I10, I01, I00, respectively. Then, the relation can be expressed by the following equation.

$$Ir1+Ir0=I11+I10=I01+I00$$

As a result, since the same charge amounts are pulled out from the bit line "bl" and the complementary bit line "/bl" to thereby lower the potentials of the bit line "bl" and the complementary bit line "/bl", so that the potential difference VBL increases as shown in FIG. 9D.

Figure 3:
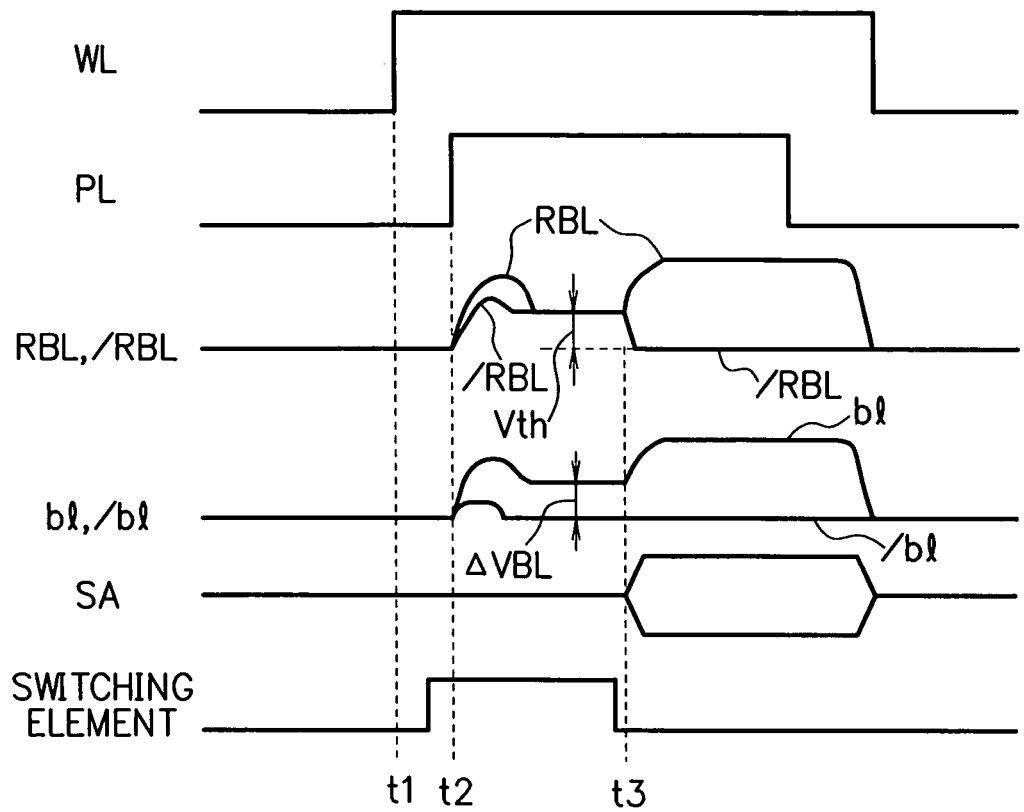
FIG. 3 is a timing chart for illustrating an operation of the ferroelectric memory in FIG. 2.

FIG. 3 is a timing chart for illustrating an operation of the ferroelectric memory in FIG. 2. Before a time "t1" the word line WL and the plate line PL are at low level. When the word line WL is at low level, the transistors 103, 104 are turned OFF, and the reference bit line RBL, the complementary reference bit line /RBL, the bit line "bl", and the complementary bit line "/bl" come to 0V. The sense amplifier (SA) 101 is in an inactive state. The switching elements 201 to 204 are turned OFF (disconnected).

Subsequently, at the time "t1", when the word line WL comes into high level, the transistors 103, 104 are turned ON. The reference bit line RBL is connected to the ferroelectric capacitor C1, the complementary reference bit line /RBL is connected to the ferroelectric capacitor C0, the bit line "bl" is connected to the ferroelectric capacitor C1, and the complementary bit line "/bl" is connected to the ferroelectric capacitor C0. Since the plate line PL is at 0V, the bit lines RBL, /RBL, "bl", "/bl" are at 0V.

Subsequently, between the time "t1" and a time "t2", the switching elements 201 to 204 are turned ON (connected).

Subsequently, at the time "t2", the plate line PL is brought into high level (for example to VP). The reference bit line RBL increases toward the potential V21, whereas it falls in due time to a threshold voltage Vth of the transistor QR1 affected by the transistor QR1. Similarly, the complementary reference bit line /RBL increases toward the potential V21, whereas it falls in due time to the threshold voltage Vth of the transistor QR0 affected by the transistor QR0.

To the gates of the transistors Q11, Q01, the potentials Vth of the reference bit line RBL are supplied. To the gates of the transistors Q10, Q00, the potentials Vth of the complementary reference bit line /RBL are supplied. The transistors Q11, Q10, Q01, Q00 serve as the current source.

The bit line "bl" increases toward the potential V21, whereas the transistors Q11 and Q10 pull out charge from the bit line "bl", so that the potential lowers to the appropriate value. This appropriate value is a potential larger than 0V. Similarly, the complementary bit line "/bl" increases toward the potential V20, whereas the transistors Q01 and Q00 pull out charge from the complementary bit line "/bl", so that the potential lowers to the appropriate value. This appropriate value is a potential smaller than the potential of the bit line "bl". The potential difference VBL between the bit line "bl" and the complementary bit line "/bl" becomes a larger appropriate value. After that, the switching elements 201 to 204 are tuned OFF.

Subsequently, at a time "t3", when the sense amplifier (SA) 101 is activated, the potential difference VBL between the bit line "bl" and the complementary bit line "/bl" is amplified. Specifically, the bit line "bl" comes to high level (power source potential) and the complementary bit line "/bl" comes to low level (0V). In accordance with the potentials of the bit line "bl" and the complementary bit line "/bl", readout data can be outputted to outside.

After that, the plate line PL is brought into low level, the sense amplifier (SA) 101 is inactivated, and the word line WL is brought into low level.

As described above, even in the case where the potentials of the bit line "bl" and the complementary bit line "/bl" are excessively large as in FIG. 9B, it is possible to lower the potentials of the bit line "bl" and the complementary bit line "/bl" to the appropriate values as in FIG. 9D by pulling out charges from the bit line "bl" and the complementary bit-line "/bl" using the current source 110, so that the potential difference VBL can be increased. A large potential difference VBL allows correct data to be outputted to outside. Note that, when the potentials of the bit line "bl" and the complementary bit line "/bl" are appropriate from the beginning, no charge is pulled out by the current source 110, allowing normal operation.

According to the present embodiment, even if the bit lines "bl", "/bl" have small parasitic capacitances, the bit lines "bl", "/bl" require no capacitance to be added, so that area increase and fluctuation in the potential difference VBL can be prevented. Without regard to the parasitic capacitances of the bit lines "bl", "/bl", it is possible to increase the potential difference VBL that is read out from the ferroelectric capacitors C1, C0 to the bit lines "bl", "/bl" in accordance with the data stored in the ferroelectric capacitors C1, C0. On the back of this, the readout data can be improved in reliability. Specifically, when the bit lines "bl", "/bl" have small capacitances, stable bit-line potentials can be obtained without the need to add new capacitance.

Third Embodiment

Figure 4:
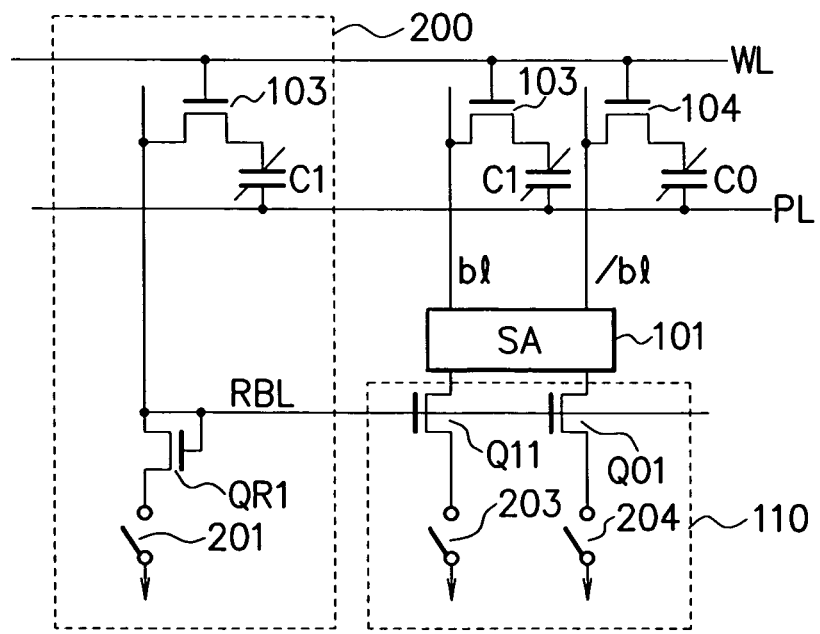
FIG. 4 is a circuit diagram showing a configuration example of a ferroelectric memory according to a third embodiment of the present invention.

FIG. 4 is a circuit diagram showing a configuration example of a ferroelectric memory according to a third embodiment of the present invention, in which the ferroelectric memory is embodied in more concrete form than that of the first embodiment. The third embodiment is basically the same as the second embodiment, and the description below will be given for differences.

According to the present embodiment, the transistor 104, the ferroelectric capacitor C0, the complementary reference bit line /RBL, the sense amplifier 101, the transistor QR0, and the switching element 202 of the second embodiment (FIG. 2) are removed from the reference circuit 200. Further, according to the present embodiment, the transistors Q10, Q00 of the second embodiment (FIG. 2) are removed from the current source 110.

That is, the reference circuit 200 includes a single transistor 103 and a single ferroelectric capacitor C1, which always generate fixed data "1" as a memory cell. The potential of the reference bit line RBL generated in the reference circuit 200 is supplied to the gates of the transistors Q11, Q01 connected to the actual memory cell.

Figure 5:
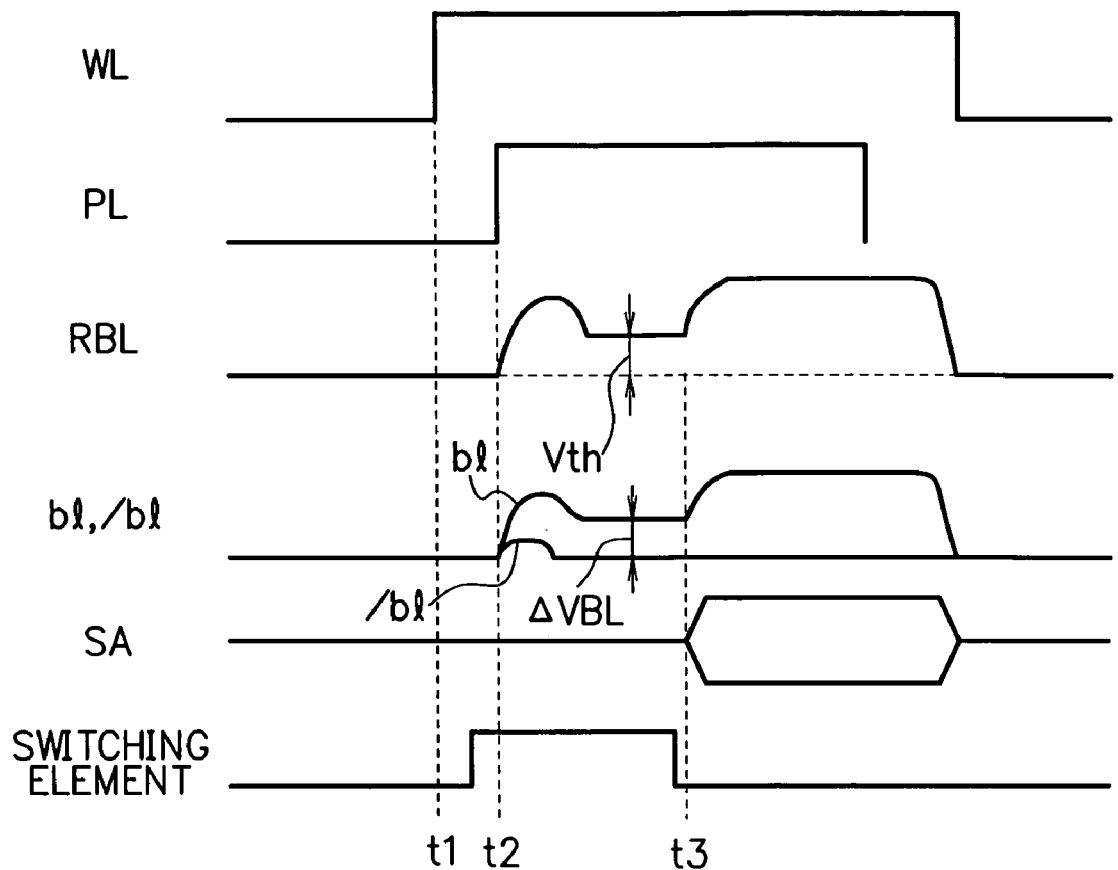
FIG. 5 is a timing chart for illustrating an operation of the ferroelectric memory in FIG. 4.

FIG. 5 is a timing chart for illustrating an operation of the ferroelectric memory in FIG. 4. The description is the same as of FIG. 3 up to the time "t2".

When the plate line PL is brought into high level (for example to VP) at the time "t2", the reference bit line RBL increases toward the potential V21, whereas falls in due time to the threshold voltage Vth of the transistor QR1 affected by the transistor QR1. The potential Vth of the reference bit line RBL is supplied to the gates of the transistors Q11, Q01.

The bit line "bl" increases toward the potential V21, whereas the potential falls to the appropriate value, since the transistor Q11 pulls out charge from the bit line "bl". Similarly, the complementary bit line "/bl" increases toward the potential V20, whereas the potential falls to the appropriate value, since the transistor Q01 pulls out charge from the complementary bit line "/bl". The potential difference VBL between the bit line "bl" and the complementary bit line "/bl" becomes a large appropriate value. Subsequent description is the same as of FIG. 3.

As has been described above, according to the first to third embodiments, without regard to the capacitances of the bit lines "bl", "/bl", it is possible to increase the potentials of the bit lines "bl", "/bl" to appropriate values, so that the potential difference VBL can be increased to larger. A large potential difference VBL allows correct data to be outputted to outside. Even when the bit lines "bl", "/bl" have small capacitances, the bit lines "bl", "/bl" require no capacitance to be added, so that area increase and fluctuation in the potential difference VBL can be prevented.

In should be noted that any of the above-described embodiments are merely concrete examples to implement the present invention, and it is to be understood that the technical scope of the present invention will not be construed restrictive by these embodiments. In other words, the present invention can be realized in various forms without departing from the technological spirit and the main features thereof.

It is possible to increase the potential difference that is read out from the ferroelectric capacitor to the bit line in accordance with the data stored in the ferroelectric capacitor, without regard to the capacitance value of the bit line. Backed by this, the readout data can be improved in reliability. In other words, when the bit line has small capacitance, it is possible to obtain stable bit line potential without the need to add new capacitance.

The present embodiments are to be considered in all respects as illustrative and no restrictive, and all changes which come within the meaning and range of equivalency of the claims are therefore intended to be embraced therein. The invention may be embodied in other specific forms without departing from the spirit or essential characteristics thereof.

What is claimed is:

1. A ferroelectric memory comprising:
   a ferroelectric capacitor to store data;
   a bit line inputting and outputting data with respect to said ferroelectric capacitor;
   a first switching element selectively connecting said ferroelectric capacitor and said bit line;
   a control circuit including a first field effect transistor to be connected to said bit line and a reference potential, and to lower potential of said bit line when said bit line is connected to said ferroelectric capacitor;
   a reference ferroelectric capacitor to store fixed data;
   a reference bit line to input and output data with respect to said reference ferroelectric capacitor;
   a reference switching element selectively connecting said reference ferroelectric capacitor and said reference bit line; and
   a second field effect transistor to be connected to said reference bit line and the reference potential,
   wherein said first field effect transistor and said second field effect transistor configure a current mirror circuit.

2. The ferroelectric memory according to claim 1, further comprising:
   a complementary ferroelectric capacitor to store complementary data with respect to the data stored in the ferroelectric capacitor;
   a complementary bit line to input and output data with respect to said complementary ferroelectric capacitor; and
   a second switching element selectively connecting said complementary ferroelectric capacitor and the complementary bit line,
   wherein said control circuit lowers the potentials of said bit line and said complementary bit line when said bit line is connected to said ferroelectric capacitor and said complementary bit line is connected to said complementary ferroelectric capacitor.

3. The ferroelectric memory according to claim 2, further comprising a sense amplifier to amplify a potential difference between said bit line and said complementary bit line.

4. The ferroelectric memory according to claim 3, wherein said control circuit includes said first field effect transistor to be connected to said bit line and the reference potential and a third field effect transistor to be connected to said complementary bit line and the reference potential.

5. The ferroelectric memory according to claim 4, further comprising:
   a complementary reference ferroelectric capacitor to store complementary fixed data with respect to the fixed data stored by the reference ferroelectric capacitor;
   a complementary reference bit line to input and output data with respect to said complementary reference ferroelectric capacitor;
   a complementary reference switching element selectively connecting said complementary reference ferroelectric capacitor and said complementary reference bit line;
   a fourth field effect transistor to be connected to said complementary reference bit line and the reference potential;
   a fifth field effect transistor to be connected in parallel to said first field effect transistor; and
   a sixth field effect transistor to be connected in parallel to said third field effect transistor,
   wherein said first field effect transistor, said second field effect transistor, and said third field effect transistor configure a current mirror circuit, and said fourth field effect transistor, said fifth field effect transistor, and said sixth field effect transistor configure a current mirror circuit.

6. The ferroelectric memory according to claim 1,
   wherein said control circuit lowers the potential of said bit line to a first potential being larger than 0V.

7. The ferroelectric memory according to claim 1,
   wherein a gate and a drain of said second field effect transistor are connected to each other and a mutual connection point thereof is connected to a gate of said first field effect transistor.

8. The ferroelectric memory according to claim 4,
   wherein a gate and a drain of said second field effect transistor are connected to each other and a mutual connection point thereof is connected to a gate of said first field effect transistor.

9. The ferroelectric memory according to claim 1, further comprising:
   a second switching element to connect or disconnect said bit line and the reference potential via said first field effect transistor; and
   a third switching element to connect or disconnect said reference bit line and the reference potential via said second field effect transistor.

10. The ferroelectric memory according to claim 4, further comprising:
    a third switching element to connect or disconnect said bit line and the reference potential via said first field effect transistor;
    a fourth switching element to connect or disconnect said reference bit line and the reference potential via said second field effect transistor; and
    a fifth switching element to connect or disconnect said complementary bit line and the reference potential via said third field effect transistor.

11. The ferroelectric memory according to claim 5,
    wherein a gate and a drain of said second field effect transistor are connected to each other and a mutual connection point thereof is connected to gates of said first field effect transistor and said third field effect transistor, and
    wherein a gate and a drain of said fourth field effect transistor are connected to each other and a mutual connection point thereof is connected to gates of said fifth field effect transistor and said sixth field effect transistor.

12. The ferroelectric memory according to claim 5, further comprising:
    a third switching element to connect or disconnect said bit line and the reference potential via said first field effect transistor and said fifth field effect transistor;
    a fourth switching element to connect or disconnect said complementary bit line and the reference potential via said third field effect transistor and said sixth field effect transistor;

a fifth switching element to connect or disconnect said reference bit line and the reference potential via said second field effect transistor; and a sixth switching element to connect or disconnect said complementary reference bit line and the reference potential via said fourth field effect transistor.

13. The ferroelectric memory according to claim 5, further comprising a sense amplifier to amplify a potential difference between said reference bit line and said complementary reference bit line.

14. The ferroelectric memory according to claim 12, further comprising a sense amplifier to amplify a potential difference between said reference bit line and said complementary reference bit line.

\* \* \* \* \*